(12) United States Patent
Wang et al.

(10) Patent No.: US 12,232,349 B2
(45) Date of Patent: Feb. 18, 2025

(54) DISPLAY DEVICE

(71) Applicant: BOE TECHNOLOGY GROUP CO., LTD., Beijing (CN)

(72) Inventors: Pinfan Wang, Beijing (CN); Chenyu Chen, Beijing (CN); Lujiang Huangfu, Beijing (CN); Fangxu Cao, Beijing (CN); Yucheng Chan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 373 days.

(21) Appl. No.: 17/229,213

(22) Filed: Apr. 13, 2021

(65) Prior Publication Data

US 2022/0085321 A1    Mar. 17, 2022

(30) Foreign Application Priority Data

Sep. 16, 2020  (CN) .......................... 202010973179.4

(51) Int. Cl.
*H01L 51/52* (2006.01)
*G02F 1/1333* (2006.01)
(Continued)

(52) U.S. Cl.
CPC ....... *H10K 50/84* (2023.02); *G02F 1/133305* (2013.01); *B32B 7/12* (2013.01);
(Continued)

(58) Field of Classification Search
None
See application file for complete search history.

(56) References Cited

U.S. PATENT DOCUMENTS

2012/0081874 A1    4/2012  Wu et al.
2013/0100053 A1*   4/2013  Kang .................... G06F 3/0445
                                                                345/173
(Continued)

FOREIGN PATENT DOCUMENTS

CN      105528569 A    4/2016
CN      206161888 U    5/2017
(Continued)

OTHER PUBLICATIONS

First Office Action for CN Patent Application No. 202010973179.4 mailed Jan. 10, 2022.

*Primary Examiner* — Eli D. Strah
(74) *Attorney, Agent, or Firm* — XSENSUS LLP

(57) ABSTRACT

The present disclosure relates to a display device, which includes a curved cover plate, an optical adhesive layer, and a display module that are sequentially disposed in a thickness direction thereof. The display module includes a curved surface region, the curved surface region being curved in at least two intersecting directions to form a spherical surface; the curved surface region comprises a first sub-area and a second sub-area, the second sub-area is located on a side of the first sub-area away from a center of curvature of the spherical surface; the second sub-area is wavy in the thickness direction, the wavy second sub-area is composed of a plurality of arc-shaped structures, and protruding directions of adjacent arc-shaped structures are opposite to each other; and the optical adhesive layer is completely attached to each of the arc-shaped structures.

16 Claims, 2 Drawing Sheets

(51) Int. Cl.
*H10K 50/84* (2023.01)
*B32B 7/12* (2006.01)
(52) U.S. Cl.
CPC ....... *B32B 2307/50* (2013.01); *B32B 2307/51* (2013.01); *B32B 2307/7376* (2023.05); *B32B 2457/20* (2013.01); *G02F 2202/28* (2013.01)

(56) References Cited

U.S. PATENT DOCUMENTS

| | | | |
|---|---|---|---|
| 2016/0252769 A1* | 9/2016 | Niiyama | G02F 1/133308 |
| | | | 428/192 |
| 2018/0113241 A1* | 4/2018 | Powell | G02B 5/32 |
| 2019/0061318 A1* | 2/2019 | Jung | B32B 7/12 |
| 2020/0057525 A1 | 2/2020 | Prest et al. | |
| 2020/0170126 A1* | 5/2020 | Ahn | G06F 1/1637 |
| 2020/0292867 A1* | 9/2020 | Kee | G02F 1/13338 |
| 2020/0026332 A1 | 10/2020 | Hong et al. | |
| 2021/0127517 A1* | 4/2021 | Kim | B32B 7/12 |

FOREIGN PATENT DOCUMENTS

| | | |
|---|---|---|
| CN | 108447405 A | 8/2018 |
| CN | 108766977 A | 11/2018 |
| CN | 110854177 A | 2/2020 |
| CN | 111131570 A | 5/2020 |
| CN | 111341932 A | 6/2020 |
| CN | 111415592 A | 7/2020 |
| CN | 111627332 A | 9/2020 |

\* cited by examiner

DISPLAY DEVICE

CROSS-REFERENCE TO RELATED APPLICATION

The present application is based upon and claims priority of Chinese Patent Application No. 202010973179.4, filed on Sep. 16, 2020, the entire disclosure of which is hereby incorporated by reference as a part of the present application.

TECHNICAL FIELD

The present disclosure relates to the field of display technologies and, in particular, to a display device.

BACKGROUND

At present, in view of the market trend, flexible display products have become favored objects of electronic devices such as mobile phones and tablet computers. The flexible display products may be designed according to different shape models matching with the electronic devices to provide different curved display requirements.

It should be noted that the information disclosed in the Background section above is only for enhancing the understanding of the background of the present disclosure, and thus may include information that does not constitute prior art known to those of ordinary skilled in the art.

SUMMARY

Embodiments of the present disclosure provide a display device, including a curved cover plate, an optical adhesive layer, and a display module that are sequentially disposed in a thickness direction thereof; wherein, the display module includes a main display area, first side areas located on both sides of the main display area in a second direction, second side areas located on both sides of the main display area in a first direction, and a corner area located between any adjacent first side area and second side area;

the corner area includes a first sub-area and a second sub-area, the second sub-area is located on a side of the first sub-area away from the main display area; the second sub-area is wavy, the wavy second sub-area is composed of a plurality of arc-shaped structures, and protruding directions of adjacent arc-shaped structures are opposite and parallel to each other; and the optical adhesive layer is completely attached to each of the arc-shaped structures;

the first direction and the second direction are perpendicular to each other, and the first direction and the second direction are parallel to a same reference plane; the thickness direction is perpendicular to the reference plane, and the protrusion direction intersects the reference plane and the thickness direction.

In an exemplary embodiment of the present disclosure, a distance from a peak to a valley of the wavy second sub-area is 10 µm to 100 µm.

In an exemplary embodiment of the present disclosure, a Young's modulus of the optical adhesive layer is 10 KPa to 100 KPa.

In an exemplary embodiment of the present disclosure, a thickness of the optical adhesive layer is 100 µm to 300 µm.

In an exemplary embodiment of the present disclosure, the display module includes a display panel and a back film, the display panel is attached to the curved cover plate via the optical adhesive layer, and the back film is disposed on a side of the display panel away from the curved cover plate; wherein, a Young's modulus of the display panel is 0.1 GPa to 10 GPa, and a Young's modulus of the back film is 0.1 GPa to 1 GPa.

In an exemplary embodiment of the present disclosure, a thickness of the display panel is 10 µm to 30 µm, and a thickness of the back film is 50 µm to 200 µm.

In an exemplary embodiment of the present disclosure, in the wavy second sub-area, a radius of curvature of the arc-shaped structure is greater than or equal to 5 mm.

In an exemplary embodiment of the present disclosure, a length of an orthographic projection of the wavy second sub-area on the reference plane is L1, and before the display module is attached to the curved cover plate via the optical adhesive layer, the second sub-area is planar, and a length of an orthographic projection of the planar second sub-area on the reference plane is L0;

wherein, a ratio between L1 and L0 is less than or equal to 98%.

In an exemplary embodiment of the present disclosure, a ratio between L1 and L0 is greater than or equal to 85%.

In an exemplary embodiment of the present disclosure, an edge area of the curved cover plate is provided with a light shielding layer;

wherein, the orthographic projection of the wavy second sub-area on the reference plane is located within an orthographic projection of the light shielding layer on the reference plane.

In an exemplary embodiment of the present disclosure, the light shielding layer is located on a side of the curved cover plate facing the optical adhesive layer.

In an exemplary embodiment of the present disclosure, a material of the light shielding layer is ink.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is understood that the drawings in the following description show only some of the embodiments of the present disclosure, and other drawings may be obtained by those skilled in the art without departing from the drawings described herein.

DETAILED DESCRIPTION

Figure 1:
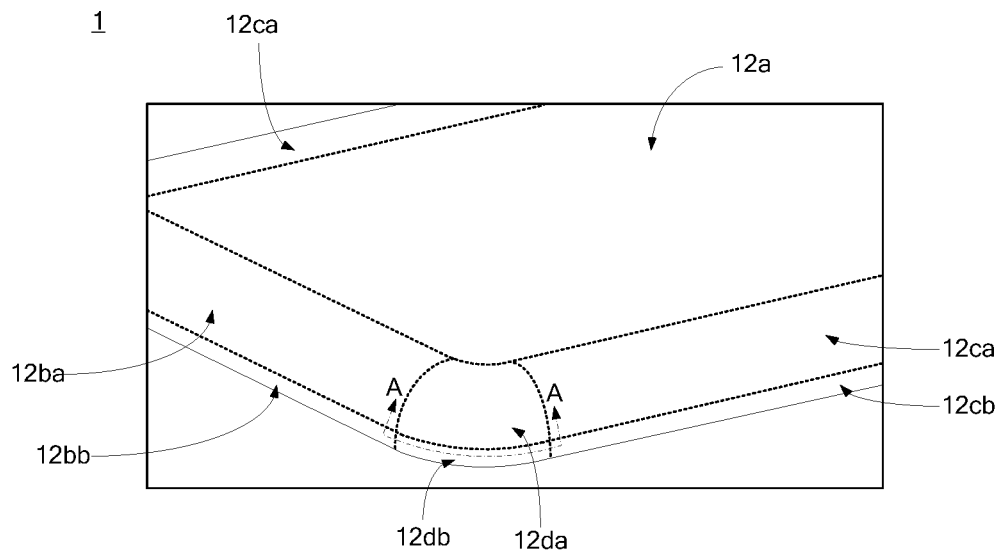
FIG. 1 is a schematic partial structural diagram of a display device described in an embodiment of the present disclosure.

In order to make objectives, technical solutions, and advantages of the present disclosure clearer, embodiments of the present disclosure will be described in detail below with reference to the accompanying drawings. Note that the embodiments may be implemented in a number of different forms. Those of ordinary skill in the art may easily understand the fact that a method and content may be transformed into various forms without departing from the purpose and scope of the present disclosure. Therefore, the present disclosure should not be interpreted as being limited to content described in the following embodiments. In a case of no conflict, the embodiments in the present disclosure and the features in the embodiments may be combined with each other arbitrarily.

In the drawings, a size of each component, a thickness of a layer, or a region may be exaggerated for clarity sometimes. Therefore, one aspect of the present disclosure is not necessarily limited to this size, and a shape and the size of each component in the drawings do not reflect a true ratio. In addition, the drawings schematically show ideal examples, and one aspect of the present disclosure is not limited to the shapes or numerical values shown in the drawings.

The ordinal numbers such as "first" and "second" in the present specification are set to avoid confusion of the constituent elements, rather than to limit in terms of the number.

In the present specification, for the sake of convenience, the use of words indicating an orientation or positional relationship, such as "above", "inside", "outside", is for explaining the positional relationship of the constituent elements with reference to the drawings. It is only for the convenience of describing the specification and simplifying the description, rather than indicating or implying that the device or element referred to must have a specific orientation, be configured, and operated in a specific orientation, and therefore cannot be understood as a limitation of the present disclosure. The positional relationship of the constituent elements is appropriately changed according to the direction in which each constituent element is described. Therefore, it is not limited to the words and sentences described in the specification, and may be changed appropriately according to the situation.

In the present specification, unless otherwise clearly defined and defined, the term "connected" should be interpreted broadly. For example, it may be a fixed connection, or a detachable connection, or an integral connection; it may be a physical connection or an electrical connection; it may be a direct connection, or an indirect connection through an intermediate member, or an internal communication between two components, or integrated two parts. For those of ordinary skill in the art, the specific meaning of the above-mentioned terms in the present disclosure may be understood in specific situations.

As shown in FIGS. 1 to 4, embodiments of the present disclosure provide a display device 1, including a curved cover plate 10, an optical adhesive layer 11, and a display module 12 that are sequentially disposed in a thickness direction thereof. That is, the display module 12 may be attached to the curved cover plate 10 via the optical adhesive layer 11.

Figure 2:
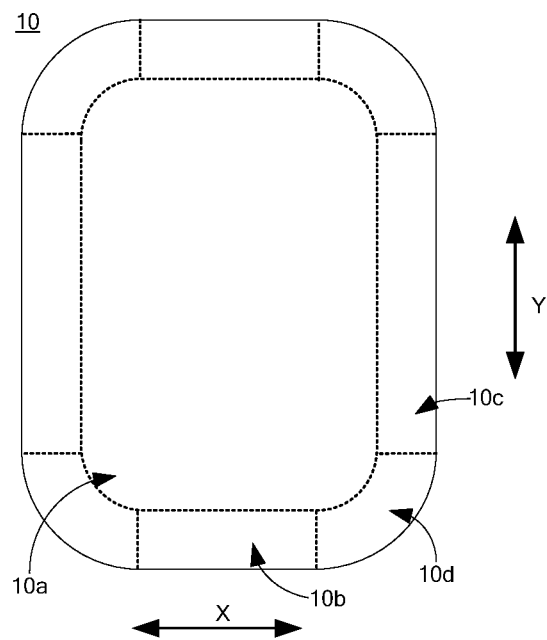
FIG. 2 is a schematic diagram of an orthographic projection of a curved cover plate in the display device shown in FIG. 1 on a reference plane.

As shown in FIG. 2, the curved cover plate 10 may be a four-sided curved cover, that is, the curved cover plate 10 may include a central area 10a and an edge area surrounding the central area 10a. The central area 10a may be flat, but is not limited thereto, and may also be spherical. The edge area may include a first cambered surface area 10b, a second cambered surface area 10c adjacent to the first cambered surface area 10b, and a corner spherical surface area 10d between the first cambered surface area 10b and the second cambered surface area 10c. The first cambered surface area 10b is provided with two, and the first cambered surface area 10b extends in a first direction X; the second cambered surface area 10c is provided with two, and the second cambered surface area 10c extends in a second direction Y. The second direction Y is perpendicular to the first direction X, and the first direction X and the second direction Y are located in a same reference plane; in addition, the thickness direction of the display device 1 is perpendicular to the reference plane. The corner spherical surface area 10d is provided with four. It should be noted that the curved cover plate 10 is not limited to the aforementioned shape, and may also have other shapes, for example, only one pair of adjacent two sides in the edge area is in a form of the cambered surface. According to an embodiment of the present disclosure, the cambered surface area may be formed as a curved surface region in which the surface is bended in one direction to form a cambered surface. For example, referring to FIG. 1, the first cambered surface area 10b is bended in the thickness direction.

For example, a radius of curvature corresponding to the first cambered surface area 10b, the second cambered surface area 10c, and the corner spherical surface area 10d in the curved cover plate 10 of the embodiments of the present disclosure may be 5 mm to 10 mm, such as: 5 mm, 6 mm, 7 mm, 8 mm, 9 mm, 10 mm, etc., but not limited to these, other values may also be possible.

Figure 3:
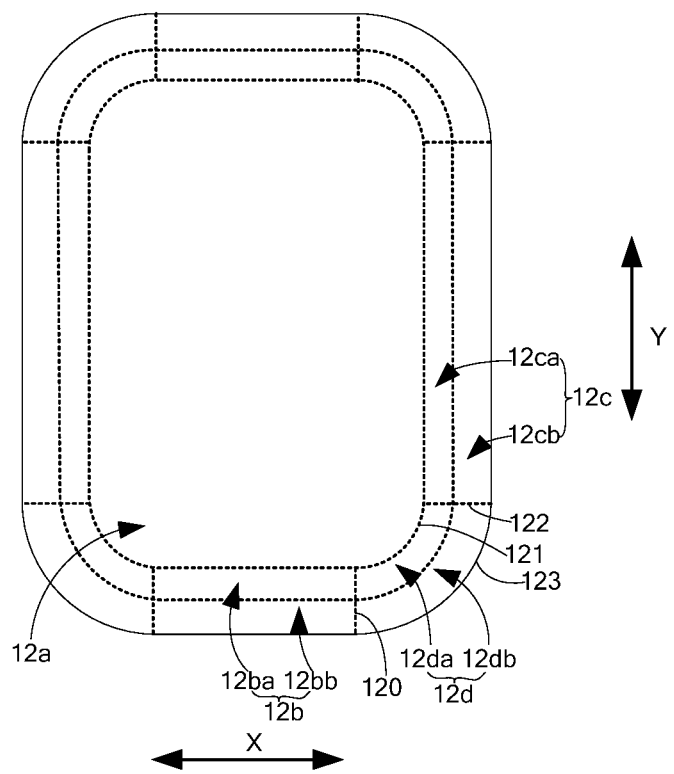
FIG. 3 is a schematic plan view of a display module in the display device shown in FIG. 1 before being attached to a curved cover plate.

The display module 12 may be a flexible display module, that is, the display module 12 may have bendable characteristics to some extent. In the embodiments of the present disclosure, as shown in FIG. 3, the display module 12 may include a main display area 12a and a peripheral area disposed around the main display area 12a. The peripheral area may include a first side area 12b extending in the first direction X, a second side area 12c extending in the second direction Y and a corner area 12d located between the first side area 12b and the second side area 12c. Specifically, the peripheral area of the display module 12 may include two first side areas 12b opposite to each other in the second direction Y, two second side areas 12c opposite to each other in the first direction X, and four corner areas 12d.

It should be understood that the main display area 12a of the display module 12 may be attached to the central area 10a of the curved cover plate 10 correspondingly, the first side area 12b of the display module 12 may be attached to the first cambered surface area 10b of the curved cover plate 10 correspondingly, the second side area 12c of the display module 12 may be attached to the second cambered surface area 10c of the curved cover plate 10, and the corner area 12d of the display module 12 may be attached to the corner spherical surface area 10d of the curved cover plate 10 correspondingly.

As shown in FIG. 2, an orthographic projection of the display module 12 of the embodiments of the present disclosure on the reference plane before being attached to the curved cover plate 10 may be in a shape of a rectangular plane, but is not limited to this, and may also have other shapes. The orthographic projection of the display module 12 on the reference plane being a rectangular plane is taken as an example for illustration, the first side area 12b and the second side area 12c may be rectangular areas, and the corner area 12d may be an arc-shaped area. The corner area 12d may have a first straight side 120, an inner arc side 121, a second straight side 122, and an outer arc side 123 that are connected end to end in sequence. The first straight side 120 is a side where the corner area 12d and the first side area 12b are adjacent to each other, the second straight side 122 is a side where the corner area 12d and the second side area 12b are adjacent to each other, the inner arc side 121 is a side in the corner area 12d that is close to the main display area 12a; the outer arc side 123 is a side in the corner area 12d that is away from the main display area 12a. For example, the inner arc side 121 may be a circular arc shape. When lengths of the first straight side 120 and the second straight side 122 are equal, the outer arc side 123 may also be a circular arc shape. However, the lengths of the first straight side 120 and the second straight side 122 may be equal or unequal, and accordingly, the outer arc side 123 may be circular or non-circular arc shape, depending on a specific situation.

It should be noted that the shape of the corner area 12d is not limited to the arc shape, and may also be fan-shaped, that is, compared to the arc-shaped corner area 12d mentioned above, the fan-shaped corner area 13 does not include the inner arc side 121, but only includes the first straight side 120, the second straight side 122, and the outer arc side 123 that are connected end to end in sequence. According to an embodiment of the present disclosure, the corner area may be formed as a curved surface region in which the surface is curved (e.g., bended) in at least two intersecting directions to form a spherical surface. For example, referring to FIG. 1, the corner area 12d is bended in a first direction perpendicular to the thickness direction, in additional to being bended in the thickness direction like the side areas 12b and 12c.

The corner area 12d may include a first sub-area 12da close to the main display area 12a and a second sub-area 12db away from the main display area 12a. In order words, the first sub-area 12da may be positioned close to a center of curvature of the corner area (e.g., a center of curvature in the first direction perpendicular to the thickness direction), and the second sub-area 12db may be positioned away from the center of curvature of the corner area. The first sub-area 12da may be a corner display area, and the second sub-area 12db may be a corner non-display area. The first side area 12b may include a first side display area 12ba close to the main display area 12a and a first side non-display area 12bb away from the main display area 12a; the second side area 12c may also include a second side display area 12ca close to the main display area 12a and a second side non-display area 12cb away from the main display area 12a.

It should be understood that the main display area 12a, the first sub-area 12da, the first side display area 12ba, and the second side display area 12ca of the display module 12 may be the main display area 12a, the first sub-area 12da, the first side display area 12ba, and the second side display area 12ca of the entire display device 1. The second sub-area 12db, the first side non-display area 12bb, and the second side non-display area 12cb of the display module 12 may be the second sub-area 12db, the first side non-display area 12bb, and the second side non-display area 12cb of the entire display device 1. In addition, it should also be understood that the main display area 12a, the first sub-area 12da, the first side display area 12ba, and the second side display area 12ca may jointly constitute the entire display area of the display module 12, that is, jointly constitute the entire display area of the display device 1; the second sub-area 12db, the first side non-display area 12bb and the second non-side display area may jointly constitute the entire non-display area of the display module 12, that is, jointly constitute the entire non-display area of the display device 1.

For example, a size of the first side area 12b in the second direction Y, a size of the first side area 12b in the first direction X, and a size of the second sub-area 12db in a radial direction of the corner area 12d may be 0.5 mm to 1 mm, such as: 0.5 mm, 0.6 mm, 0.7 mm, 0.8 mm, 0.9 mm, 1 mm, etc. It should be understood that the size of the first side area 12b in the second direction Y, the size of the first side area 12b in the first direction X, and the size of the second sub-area 12db in the radial direction of the corner area 12d may have a value range as a value range when the display module 12 is flat as a whole, that is, before the display module 12 is attached to the curved cover plate 10; and after the display module 12 is attached to the curved cover plate 10, the size of the first side area 12b in the second direction Y, the size of the first side area 12b in the first direction X, and the size of the second sub-area 12db in the radial direction of the corner area 12d may be changed according to the actual bending requirements.

It should be noted that the radial direction mentioned in the embodiments of the present disclosure refers to a direction of the radius of curvature.

Figure 4:
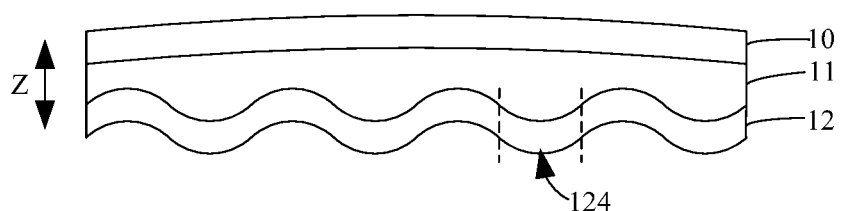
FIG. 4 is a cross-sectional view of the display device of the embodiment shown in FIG. 1 along the line A-A.

In the embodiments of the present disclosure, the display module 12 as a whole has incompressible characteristics; when the display module 12 is attached to the curved cover plate 10, a side of the display module 12 away from the curved cover plate 10 is subjected to compressive stress, and after the display module 12 is subject to the compressive stress, wavy folds will be formed due to its incompressibility characteristics, as shown in FIG. 4; locations of the wavy folds may be specifically located at the second sub-area 12db.

In detail, when the display module 12 is attached to the curved cover plate 10, the main display area 12a of the display module 12 has a same shape as the central area 10a of the curved cover plate 10. For example, when the central area 10a of the curved cover plate 10 is flat, the main display area 12a of the display module 12 is also flat. When the central area 10a of the curved cover plate 10 is spherical, the main display area 12a of the display module 12 is also spherical, and the first side area 12b and the second side area 12c of the display module 12 may be cambered surfaces, the first sub-area 12da of the corner area 12d of the display module 12 may be spherical, and the second sub-area 12db of the corner area 12d of the display module 12 may be wavy, as shown in FIG. 4. This wavy second sub-area 12db is composed of a plurality of arc-shaped structures 124. It should be understood that protruding directions Z of adjacent arc-shaped structures 124 are opposite and substantially parallel to each other, and a wave starting and a wave end of the wavy first sub-area 12da are respectively located on the first straight side 120 and the second straight side 122 of the corner area 12d.

In addition, it should be noted that the protrusion direction Z of the arc-shaped structure 124 is generally in the thickness direction of the display module. However, it should be noted that the corner area has a curved shape and is squeezed by the curved cover, the actual protrusion direction of the arc-shaped structure 124 may deviate from the thickness direction, that is, it may intersect the aforementioned reference plane and thickness direction.

Since the second sub-area 12db is formed into wavy folds due to its incompressibility after the display module 12 is attached to the curved cover plate 10, it may be seen that after the display module 12 is attached to the curved cover plate 10, a length of the orthographic projection of the second sub-area 12db on the reference plane is shorter than that before the display module 12 is attached to the curved cover plate 10.

It should be understood that the length of the orthographic projection of the second sub-area 12db on the reference plane refers to an arc length from the first straight side 120 to the second straight side 122 in the corner area 12d; and the reference plane mentioned in the embodiments of the present disclosure is a plane perpendicular to the thickness direction of the display device 1. In other words, the reference plane is a plane perpendicular to the first direction X and the second direction Y.

In addition, as shown in FIG. 4, after the display module 12 is attached to the curved cover plate 10 via the optical adhesive layer 11, the optical adhesive layer 11 is completely attached to the arc-shaped structure 124 of the second sub-area 12db. Specifically, a surface contour of the optical adhesive layer 11 that is attached to the curved cover plate 10 is the same as that of the curved cover plate 10, that is, the surface contour of the optical adhesive layer 11 that is attached to the curved cover plate 10 is relatively flat. A surface contour of the layer 11 that is attached to the display module 12 is the same as that of the display module 12, that is, the surface contour of the optical adhesive layer 11 that is attached to the second sub-area 12db of the display module 12 is wavy as a whole. Surface contours of the optical adhesive layer 11 that are attached to other areas of the display module 12 (for example, the first sub-area 12da, the main display area 12a, etc.) are relatively flat, so that the optical adhesive layer 11 is completely attached to the curved cover plate 10 and the display module 12, so as to ensure that the curved cover plate 10 and the display module 12 have a good attachment effect.

In the embodiments of the present disclosure, before the display module 12 is attached to the curved cover plate 10 via the optical adhesive layer 11, the length of the orthographic projection of the second sub-area 12db on the reference plane is L0. After the display module 12 is attached to the curved cover plate 10 via the optical adhesive layer 11, the length of the orthographic projection of the second sub-area 12db on the reference plane is L1. A ratio between L1 and L0 is less than or equal to 98%; that is, after the display module 12 is attached to the curved cover plate 10, the length of the orthographic projection of the second sub-area 12db on the reference plane is shortened compared to that before the display module 12 is attached to the curved cover plate 10, and an amount of shorting is greater than 2%.

Since the second sub-area 12db is provided with a certain amount of length after the display module 12 is attached to the curved cover plate 10 via the optical adhesive layer 11 to form the wavy folds, an amplitude of the wavy folds may be reduced, thereby enabling the optical adhesive layer 11 to better fill up the wavy folds to ensure the attachment effect of the display module 12 and the curved cover plate 10.

It should be understood that, in order to make sizes of the arc-shaped structures 124 in the wavy folds formed in the second sub-area 12db after the display module 12 is attached to the curved cover plate 10 via the optical adhesive layer 11 more uniform, the compressed length of the second sub-area 12db should not be too long. That is, the ratio between L1 and L0 needs to be greater than or equal to 85%, that is to say, after the display module 12 is attached to the curved cover plate 10, the length of the orthographic projection of the second sub-area 12db on the reference plane may be shortened compared to that before the display module 12 is attached to the curved cover plate 10, and the amount of shorting needs to be less than 15%.

Specifically, after the display module 12 is attached to the curved cover plate 10, the length of the orthographic projection of the second sub-area 12db on the reference plane may be shortened compared to that before the display module 12 is attached to the curved cover plate 10, and the amount of shorting is 3%, 4%, 5%, 6%, and so on.

In the embodiments of the present disclosure, after the display module 12 is attached to the curved cover plate 10, in order to enable the optical adhesive layer 11 to better fill up the wavy second sub-area 12db to be flat, an optical adhesive material with a Young's modulus of 10 KPa to 100 KPa may be used to make the optical adhesive layer 11. That is to say, the Young's modulus of the optical adhesive layer 11 in the embodiments of the present disclosure may be 10 KPa to 100 KPa, such as: 10 KPa, 30 KPa, 50 KPa, 70 KPa, 100 KPa, etc.

In addition, a thickness of the optical adhesive layer 11 may be 100 μm to 300 μm, such as 100 μm, 150 μm, 200 μm, 250 μm, 300 μm, and so on.

Figure 5:
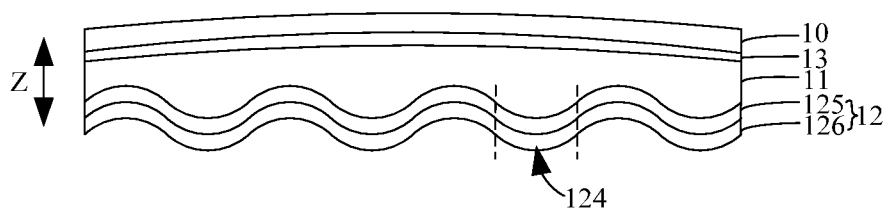
FIG. 5 is a cross-sectional view of the display device of another embodiment shown in FIG. 1 along the line A-A.

In the embodiments of the present disclosure, as shown in FIG. 5, the display module 12 may include a display panel 125 and a back film 126. The display panel 125 is attached to the curved cover plate 10 via the optical adhesive layer 11, and the back film 126 is disposed on a side of the display panel 125 away from the curved cover plate 10. A Young's modulus of the display panel 125 may be 0.1 GPa to 10 GPa, such as: 0.1 GPa, 1 GPa, 3 GPa, 5 GPa, 7 GPa, 10 GPa, etc.; a Young's modulus of the back film 126 may be 0.1 GPa to 1 GPa, such as: 0.1 GPa, 0.3 GPa, 0.5 GPa, 0.7 GPa, 1 GPa, etc., so that the design may make an amount of compression of the second sub-area 12db after the display module 12 is attached to the curved cover plate 10 may meet the demands.

It should be noted that the display panel 125 of the embodiments of the present disclosure is a composite substrate composed of different materials. That is, the display panel 125 may include a PI (polyimide) substrate, a TFT (thin film transistor) array driving layer, and an OLED (organic light emitting diode) light-emitting layer, a packaging film layer, etc.; therefore, the Young's modulus of the display panel 125 mentioned in the embodiments of the present disclosure is an equivalent Young's modulus.

A thickness of the display panel 125 may be 10 μm to 30 μm, such as: 10 μm, 15 μm, 20 μm, 25 μm, 30 μm, etc.; and a thickness of the back film 126 may be 50 μm to 200 μm, such as: 50 μm, 100 μm, 150 μm, 200 μm, etc. Such a design may further enable the amount of compression of the second sub-area 12db after the display module 12 is attached to the curved cover plate 10 to meet the demands.

In the embodiments of the present disclosure, a portion of the display panel 125 located in the second sub-area 12db may include at least one of a wiring structure, a thin film transistor, and a capacitor structure. For example, the portion of the display panel 125 located in the second sub-area 12db may include metal traces. In order to prevent the metal traces at the second sub-area 12db from breaking after the display module 12 is attached to the curved cover plate 10, it is necessary to ensure that the radius of curvature of each arc-shaped structure 124 formed in the second sub-area 12db after the display module 12 is attached to the curved cover plate 10 is greater than or equal to 5 mm, such as 5 mm, 6 mm, 10 mm, 16 mm, and so on.

When the display module 12 is attached to the curved cover plate 10, a distance from a peak to a valley of the wavy second sub-area 12db may be 10 μm to 100 μm, such as 10 μm, 30 50 μm, 70 μm, 100 μm, etc., so that the optical adhesive layer 11 may better fill the wavy folds to be flat, thereby ensuring the attachment effect of the display module 12 and the curved cover plate 10.

In the embodiments of the present disclosure, as shown in FIG. 5, the edge area of the curved cover plate 10 may be provided with a light shielding layer 13. Specifically, the light shielding layer 13 may be located on a side of the curved cover plate 10 facing the optical adhesive layer 11. For example, a material of the light shielding layer 13 may be ink, but it is not limited to this, and may also be other materials.

After the display module 12 is attached to the curved cover plate 10, the orthographic projection of the wavy second sub-area 12db on the reference plane is located within an orthographic projection of the light shielding layer 13 on the reference plane, that is, the light shielding layer 13 may shield the wavy second sub-area 12db to improve product quality and appearance texture; it should be understood that the light shielding layer 13 is not limited to only shield the wavy second sub-area 12db, but also shield the side non-display area of the display module 12.

It should be noted that an area where the light shielding layer 13 is located should only correspond to the entire non-display area of the display module 12, that is, the orthographic projection of the light shielding layer 13 on the reference plane completely overlaps with an orthographic projection of the entire non-display area of the display module 12 on the reference plane, so as to not only shield the entire non-display area of the display module 12, but also prevent the light shielding layer 13 from shielding the entire display area of the display module 12, thereby ensuring the display area.

Since the curved cover plate 10 has a structure with four curved sides, its edge area has a certain inclination angle compared to the central area 10a. Therefore, when the display device 1 is viewed from a front viewing angle, the shielding layer of the edge area is hardly seen or only a small part of the shielding layer may be seen, in order to achieve the effect of no border or basically no border.

In the embodiments of the present disclosure, a specific type of the display device 1 is not particularly limited, and all types of display devices commonly used in the art may be used, such as mobile phones, tablets, watches, etc., and those skilled in the art may make a corresponding selection according to the specific purpose of the display device, and it will not be repeated here. It should be noted that, in addition to the display module 12, the optical adhesive layer 11, and the curved cover plate 10, the display device 1 also includes other necessary components. Taking a display as an example, specifically, the display may include for example a housing, a circuit board, a power wire, etc. Those skilled in the art may make corresponding supplements according to the specific usage requirements of the display device 1, which will not be repeated here.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display device, comprising:
    a curved cover plate, an optical adhesive layer, and a display module that are sequentially disposed in a thickness direction thereof, wherein:
    the display module comprises a curved surface region, the curved surface region being curved in at least two intersecting directions to form a spherical surface;
    the curved surface region comprises a first sub-area and a second sub-area, the second sub-area being located on a side of the first sub-area away from a center of curvature of the spherical surface;
    the second sub-area is wavy in the thickness direction, the wavy second sub-area comprising a plurality of arc-shaped structures, and protruding directions of adjacent arc-shaped structures being opposite to each other; and
    the optical adhesive layer is completely attached to each of the arc-shaped structures,
    wherein the display module comprises a display panel and a back film, the display panel is attached to the curved cover plate via the optical adhesive layer, and the back film is disposed on a side of the display panel away from the curved cover plate, and the display panel comprises a polyimide (PI) substrate, a thin film transistor (TFT) array driving layer, and an organic light emitting diode (OLED) light-emitting layer, and a packaging film layer,
    wherein the second sub-area comprising the PI substrate, the TFT array driving layer, the OLED light-emitting layer and the packaging film layer as a whole has incompressible characteristics, and the second sub-area comprising the PI substrate, the TFT array driving layer, the OLED light-emitting layer and the packaging film layer is formed into wavy folds due to its incompressibility, and
    wherein a Young's modulus of the display panel comprising the PI substrate, the TFT array driving layer, the OLED light-emitting layer and the packaging film layer is 0.1 GPa to 10 GPa, and a Young's modulus of the back film is 0.1 GPa to 1 GPa.

2. The display device according to claim 1, wherein a distance from a peak to a valley of the wavy second sub-area is 10 μm to 100 μm.

3. The display device of claim 2, wherein a Young's modulus of the optical adhesive layer is 10 KPa to 100 KPa.

4. The display device of claim 3, wherein a thickness of the optical adhesive layer is 100 μm to 300 μm.

5. The display device of claim 1, wherein a thickness of the display panel is 10 μm to 30 μm, and a thickness of the back film is 50 μm to 200 μm.

6. The display device according to claim 1, wherein in the wavy second sub-area, a radius of curvature of at least one arc-shaped structure is greater than or equal to 5 mm.

7. The display device of claim 1, wherein:
    a length of an orthographic projection of the wavy second sub-area on a reference plane perpendicular to the thickness direction is L1 and, before the display module is attached to the curved cover plate via the optical adhesive layer, the second sub-area is planar, and a length of an orthographic projection of the planar second sub-area on the reference plane is L0; and a ratio between L1 and L0 is less than or equal to 98%.

8. The display device of claim 7, wherein a ratio between L1 and L0 is greater than or equal to 85%.

9. The display device according to claim 1, wherein:
    an edge area of the curved cover plate is provided with a light shielding layer; and
    an orthographic projection of the wavy second sub-area on a reference plane is located within an orthographic projection of the light shielding layer on the reference plane.

10. The display device of claim 9, wherein the light shielding layer is located on a side of the curved cover plate facing the optical adhesive layer.

11. The display device of claim 10, wherein the light shielding layer is made of ink.

12. The display device of claim 1, wherein the display device comprises a main display area and a curved display area extended from an edge of the main display area, and the curved surface region is positioned in the curved display area.

13. The display device of claim 12, wherein the curved display area comprises a first region extending in a first direction and a second region extending in a second direction, and the curved surface region is continuous with both the first area and the second area and is positioned at an intersection of the first area and the second area.

14. The display device of claim 12, wherein the second sub-area is located on a side of the first sub-area away from the main display area.

15. The display device of claim 1, wherein the spherical surface is bended in the thickness direction and meanwhile bended in a first direction perpendicular to the thickness direction, and the center of curvature of the spherical surface is a center of curvature of bending in the first direction.

16. A method, comprising:
  providing a display device, the display device comprising a curved cover plate, an optical adhesive layer, and a display module that are sequentially disposed in a thickness direction thereof, wherein:
    the display module comprises a curved surface region, the curved surface region being curved in at least two intersecting directions to form a spherical surface;
    the curved surface region comprises a first sub-area and a second sub-area, the second sub-area being located on a side of the first sub-area away from a center of curvature of the spherical surface;
    the second sub-area is wavy in the thickness direction, the wavy second sub-area comprising a plurality of arc-shaped structures, and protruding directions of adjacent arc-shaped structures being opposite to each other; and
    the optical adhesive layer is completely attached to each of the arc-shaped structures,
  wherein the display module comprises a display panel and a back film, the display panel is attached to the curved cover plate via the optical adhesive layer, and the back film is disposed on a side of the display panel away from the curved cover plate, and the display panel comprises a polyimide (PI) substrate, a thin film transistor (TFT) array driving layer, and an organic light emitting diode (OLED) light-emitting layer, and a packaging film layer,
  wherein the second sub-area comprising the PI substrate, the TFT array driving layer, the OLED light-emitting layer and the packaging film layer as a whole has incompressible characteristics, and the second sub-area comprising the PI substrate, the TFT array driving layer, the OLED light-emitting layer and the packaging film layer is formed into wavy folds due to its incompressibility, and
  wherein a Young's modulus of the display panel comprising the PI substrate, the TFT array driving layer, the OLED light-emitting layer and the packaging film layer is 0.1 GPa to 10 GPa, and a Young's modulus of the back film is 0.1 GPa to 1 GPa.

* * * * *